(12) United States Patent
Lou

(10) Patent No.: US 10,755,954 B2
(45) Date of Patent: Aug. 25, 2020

(54) SILICON WAFER PRINTING MACHINE

(71) Applicant: Folungwin Automatic Equipment Co., Ltd., Dongguan (CN)

(72) Inventor: Benny Lou, Dongguan (CN)

(73) Assignee: Folungwin Automatic Equipment Co., Ltd., Dongguan (CN)

(*) Notice: Subject to any disclaimer, the term of this patent is extended or adjusted under 35 U.S.C. 154(b) by 206 days.

(21) Appl. No.: 16/085,576

(22) PCT Filed: Mar. 26, 2018

(86) PCT No.: PCT/CN2018/080456
§ 371 (c)(1),
(2) Date: Sep. 16, 2018

(87) PCT Pub. No.: WO2019/007108
PCT Pub. Date: Jan. 10, 2019

(65) Prior Publication Data
US 2020/0227297 A1    Jul. 16, 2020

(30) Foreign Application Priority Data
Jul. 3, 2017  (CN) .......................... 2017 1 0534291

(51) Int. Cl.
*H01L 21/677* (2006.01)
*H01L 31/18* (2006.01)
*H01L 21/68* (2006.01)

(52) U.S. Cl.
CPC ...... *H01L 21/67706* (2013.01); *H01L 21/681* (2013.01); *H01L 31/1804* (2013.01)

(58) Field of Classification Search
CPC ......... H01L 21/67706; H01L 21/67703; H01L 21/681; H01L 2221/67; B41F 17/00
See application file for complete search history.

(56) References Cited

FOREIGN PATENT DOCUMENTS

| CN | 101961947 A | 2/2011 |
|---|---|---|
| CN | 201849048 U | 6/2011 |

(Continued)

*Primary Examiner* — Kaitlin S Joerger
(74) *Attorney, Agent, or Firm* — Zhihua Han; Wen IP LLC

(57) ABSTRACT

The disclosure discloses a silicon wafer printing machine comprising a rack, wherein a middle part partition plate is arranged at the middle part of the rack, a visual system installation plate being arranged at the upper part of the rack, a rotary table is installed on the middle part partition plate, a driving device for controlling the rotary table to rotate according to a fixed rotational angle is arranged at the bottom of the middle part partition plate, the rotational angle of the rotary table controlled by the driving device is 90 degrees every time, a group of dual-motor roll paper conveying devices is arranged at an interval of 90 degrees on the edge of the rotary table, conveying lines spliced by a plurality of charging and discharging modularized conveying devices are arranged on the left side and the right side of the rack respectively, a modularized scraper device is arranged on the rear side of the rotary table, and a spline shaft lifting device for controlling the modularized scraper device to go up or go down is arranged at the bottom of the middle part partition plate. Compared with a traditional conveyer device, the product saves the cost of a clutch, the structure is also greatly simplified, and the roll paper belts are easier to maintain and change in later period. The dual-motor conveying devices can prevent the product from being deviated.

10 Claims, 4 Drawing Sheets

(56) References Cited

FOREIGN PATENT DOCUMENTS

| | | |
|---|---|---|
| CN | 202337053 U | 7/2012 |
| CN | 202608219 U | 12/2012 |
| CN | 204696081 U | 10/2015 |
| CN | I07187191 A | 9/2017 |
| CN | 207088699 U | 3/2018 |
| WO | WO-2019007108 A1 * | 1/2019 ............. B41F 17/00 |

* cited by examiner

SILICON WAFER PRINTING MACHINE

CROSS-REFERENCE TO RELATED APPLICATION

This application is a national stage application of International application number PCT/CN2018/080456, filed Mar. 26, 2018, titled "A SILICON WAFER PRINTING MACHINE," which claims the priority benefit of Chinese Patent Application No. CN201710534291.6, filed on Jul. 3, 2017, which is hereby incorporated by reference in its entirety.

TECHNICAL FIELD

The disclosure relates to photovoltaic solar silicon wafer printing equipment, in particular to a silicon wafer printing machine.

BACKGROUND

A photovoltaic solar silicon wafer is a core part in a solar power generation system, and is also the part with the highest value in the solar power generation system. The photovoltaic solar silicon wafer plays a role in converting solar energy into electric energy, and the electric energy is fed into a storage battery for storage or directly used for driving a load to operate. The quality and cost of the photovoltaic solar silicon wafer directly determine the quality and cost of the whole solar power generation system.

Along with the technology accumulation of semiconductor equipment industry in several tens of years, photovoltaic equipment enterprises basically have the whole production line equipment capacity of solar battery manufacturing equipment. A photovoltaic solar silicon wafer printing machine has already been widely applied to printing production of photovoltaic solar silicon wafers, the photovoltaic solar silicon wafer printing machine is greatly advanced in the aspects of accuracy and automation through years of development, and the photovoltaic solar silicon wafer printing machine has a repeated printing capacity in micron scale dimensions. One of the most important steps of printing the photovoltaic solar silicon wafer is manufacturing extremely fine circuits on the front face and back face of the silicon wafer, and the metal coating technology is generally completed by a screen printing technique, namely forming a circuit or an electrode on the silicon wafer through silk screen mesh pressing of a conducting paste containing metal. Therefore, the quality of the photovoltaic solar silicon wafer depends on the equipment quality of the photovoltaic solar silicon wafer printing machine to a large extent.

According to an existing photovoltaic solar silicon wafer printing machine, the transportation of silicon wafers is unstable and is easily damaged, the silicon wafers are easy to deviate, the printing accuracy is not high enough, more defective products exist, and the printing efficiency is low.

SUMMARY

The disclosure aims to solve the abovementioned defects in the prior art, and provides a silicon wafer printing machine.

In order to solve the abovementioned defects in the prior art, the technical scheme provided by the invention is as follows: the silicon wafer printing machine comprises a rack; a middle part partition plate is arranged at the middle part of the rack; a visual system installation plate is arranged at the upper part of the rack; a rotary table is installed on the middle part partition plate; a driving device for controlling the rotary table to rotate according to a fixed rotational angle is arranged at the bottom of the middle part partition plate; the rotational angle of the rotary table controlled by the driving device is 90 degrees every time; a group of dual-motor roll paper conveying devices is arranged at an interval of 90 degrees on the edge of the rotary table; conveying lines spliced by a plurality of feeding and discharging modularized conveying devices are arranged on the left side and the right side of the rack respectively; a modularized scraper device is arranged on the rear side of the rotary table; and a spline shaft lifting device for controlling the modularized scraper device to go up or go down is arranged at the bottom of the middle part partition plate.

As an improvement of the silicon wafer printing machine, when the rotary table rotates at 90 degrees every time, one dual-motor roll paper conveying device corresponds to the position of the modularized scraper device, and one dual-motor roll paper conveying device corresponds to the conveying lines.

As an improvement of the silicon wafer printing machine, each dual-motor roll paper conveying device comprises a motor support, two side-by-side motor installation sites are arranged on the motor support, motors are arranged at the upper parts of the two motor installation sites respectively, two roll paper roller supporting arms are arranged at the lower parts of the motor installation sites respectively, roll paper rollers are arranged on the two roll paper roller supporting arms, the output shafts of the two rotors stretch out from one side of the motor support and driving wheels are installed on the stretched output shafts, one end of each of the two roll paper rollers stretches out from one side of the motor support respectively and driven wheels are installed on the starched roller parts, the driving wheels are connected with the driven wheels through synchronous belts, and the two motors operate alternatively.

As an improvement of the silicon wafer printing machine, the two motors comprise a feeding motor and a discharging motor respectively, the discharging motor does not operate when the feeding motor operates, and the feeding motor does not operate when the discharging motor operates.

As an improvement of the silicon wafer printing machine, a tensioning wheel waist-shaped installation hole is formed in one side of each the two motors corresponding to the position of the corresponding synchronous belt respectively, and a tensioning wheel capable of adjusting the tensioning force of the corresponding synchronous belt is installed inside each tensioning wheel waist-shaped installation hole.

As an improvement of the silicon wafer printing machine, each tensioning wheel is used for adjusting the degree of tightness through an adjusting screw, tensioning sleeves are installed on the two driving wheels respectively, a glass table panel is arranged at the upper end of the motor support, a screw installation platform is arranged at the positions of four corners of the glass table panel respectively, a driven shaft is spanned on every two screw installation platforms corresponding to each other, and the two driven shafts and the two roll paper rollers are connected through paper belts.

As an improvement of the silicon wafer printing machine, the spline shaft lifting device comprises an upper fixed plate and a lower fixed plate, four upper spline shaft seats are arranged on the upper fixed plate at intervals, four lower spline shaft seats are arranged on the lower fixed plate at intervals, the upper spline shaft seats and the lower spline shaft seats are connected through spline shafts, each of the four spline shafts is internally provided with a lifting screw rod respectively, a synchronous wheel control device for controlling the four lifting screw rods to move up and down simultaneously is arranged on the bottom surface of the lower fixed plate, and the upper fixed plate and the lower fixed plate are positioned on the edges of spline shafts and are connected through a plurality of supporting shafts.

As an improvement of the silicon wafer printing machine, the synchronous wheel control device comprises a servo motor installed at the middle part of the lower fixed plate, L-shaped positioning seats are arranged on the lower panel of the lower fixed plate and correspond to the positions of the lifting screw rods, the output shaft of the servo motor penetrates from the lower fixed plate and motor synchronous wheels are arranged on penetrated shaft rods, the lower ends of the four lifting screw rods stretch out from the lower fixed plate and lifting screw rod synchronous wheels are installed on the stretched screw rods, the bottoms of the lifting screw rod synchronous wheels are installed on the L-shaped positioning seats, a tensioning sleeve sleeves one end of each lifting screw rod installation lifting screw rod synchronous wheel, and the lifting screw rod synchronous wheels and the motor synchronous wheels are connected through the synchronous belts.

A tensioning synchronous wheel fixed seat is arranged on the upper surface of the lower fixed plate, a tensioning synchronous wheel fixed shaft is installed on the tensioning synchronous wheel fixed seat, the tensioning synchronous wheel fixed shaft penetrates out from the lower fixed plate, tensioning synchronous wheels are installed on the penetrated shaft rods, and the tensioning synchronous wheels are connected with the lifting screw rod synchronous wheels and the motor synchronous wheels through the synchronous belts.

The operation of the servo motor drives the motor synchronous wheels, the motor synchronous wheels drive the four lifting screw rod synchronous wheels through the synchronous belts, and when the lifting screw rod synchronous wheels rotate, the four lifting screw rods go up simultaneously or go down simultaneously; the two tensioning synchronous wheels are positioned on two sides of the synchronous belts respectively for tensioning the synchronous belts, and the two tensioning synchronous wheels can adjust the tightness transversely; and a wire hole is formed in the middle part of the upper fixed plate.

As an improvement of the silicon wafer printing machine, each feeding and discharging modularized conveying device comprises a guide rail supporting platform, two guide rail supporting seats arranged vertical to the guide rail supporting platform are arranged on the lower surface of the guide rail supporting platform, a motor installation seat is arranged between the two guide rail supporting seats, a stepper motor is arranged on the motor installation seat, a belt conveying assembly is arranged on the upper surface of the guide rail supporting platform, the stepper motor drives the belt conveying assembly to move, and the guide rail supporting seats are connected with the guide rail supporting platform to form a T-shaped support.

As an improvement of the silicon wafer printing machine, the belt conveying assembly comprises L-shaped guide roller supporting arms installed at two ends of the guide rail supporting platform respectively, two rollers are spanned on the two L-shaped guide roller supporting arms on the same side, belt wheels are arranged at two ends of the two rollers respectively, and every two corresponding belt wheels are connected through the synchronous belts.

An installation hole is formed in the middle part of each guide rail supporting platform, and each installation hole is internally provided with a light sensor for sensing the incoming of products; the driving wheels are installed on the output shaft of the stepper motor, and the driving wheels are connected with the synchronous belts; two rubber wheel waist-shaped installation hole sites are arranged on one side of each guide rail supporting platform, the two rubber wheel waist-shaped installation hole sites are internally provided with driven rubber wheels capable of adjusting left and right positions, and the two driven rubber wheels are connected with the synchronous belts; guide rail installation sleeves are arranged at the upper ends of the two guide rail supporting seats respectively, and the two guide rail supporting seats are H-shaped.

Compared with the prior art, the silicon wafer printing machine has the advantages that the feeding motor and the discharging motor are adopted, the discharging motor does not operate when the feeding motor operates, the feeding motor does not operate when the discharging motor operates, one roll paper roller is controlled by the feeding motor, the other roll paper roller is controlled by the discharging motor, and the tensioning wheels capable of adjusting the tensioning force are arranged so that roll paper belts are tensioned. Compared with a traditional conveyer device, the product saves the cost of a clutch, the structure is also greatly simplified, and the roll paper belts are easier to maintain and change in later period. The dual-motor conveying devices can prevent the product from being deviated. According to the product, only two driven shafts need to be arranged on the glass table panel, the paper belts are connected with the two roll paper rollers, and the driven shafts are driven by the roll paper rollers through the paper belts directly.

The four lifting screw rods are controlled to go up simultaneously through the servo motor in a lifting manner adopted in the disclosure, the four screw rods are arranged inside the spline shafts respectively, the spline shafts are fixed on the upper spline shaft seat and the lower spline shaft seats, and the movement and synchronous operation of the four screw rods are guaranteed. The device is high in assembly accuracy, greater in load, longer in service life and convenient to maintain.

BRIEF DESCRIPTION OF THE DRAWINGS

The disclosure and the beneficial technical effects of the disclosure are further described in conjunction with the following drawings and embodiments.

The names of marks in the figures are as follows: 051, motor support; 052, motor installation site; 053, motor; 054, roll paper roller supporting arm; 055, roll paper roller; 056, driving wheel; 057, driven wheel; 058, synchronous belt; 059, tensioning wheel waist-shaped installation hole; 0510, tensioning wheel; 0511, adjusting screw; 0512, tensioning sleeve; 0513, glass table panel; 0514, screw installation platform; 0515, driven shaft; 091, upper fixed plate; 092, lower fixed plate; 093, upper spline shaft seat; 094, lower spline shaft seat; 095, spline shaft; 096, lifting screw rod; 097, synchronous wheel control device; 098, supporting shaft; 099, tensioning synchronous wheel fixed seat; 0910, tensioning synchronous wheel fixed shaft; 0911, tensioning synchronous wheel; 0912, wire hole; 0913, tensioning sleeve; 0971, servo motor; 0972, L-shaped positioning seat; 0973, motor synchronous wheel; 0974, lifting screw rod synchronous wheel; 061, guide rail supporting platform; 062, guide rail supporting seat; 063, motor installation seat; 064, stepper motor; 065, belt conveying assembly; 066, installation hole; 067, light sensor; 068, driving wheel; 069, rubber wheel waist-shaped installation hole site; 0610, driven rubber wheel; 0611, guide rail installation sleeve; 0651, L-shaped guide roller supporting arm; 0652, roller; 0653, belt wheel; and 0654, synchronous belt.

DESCRIPTION OF THE EMBODIMENTS

The disclosure is further described in conjunction with the following drawings and embodiments, but the embodiments are not limited to this.

Figure 1:
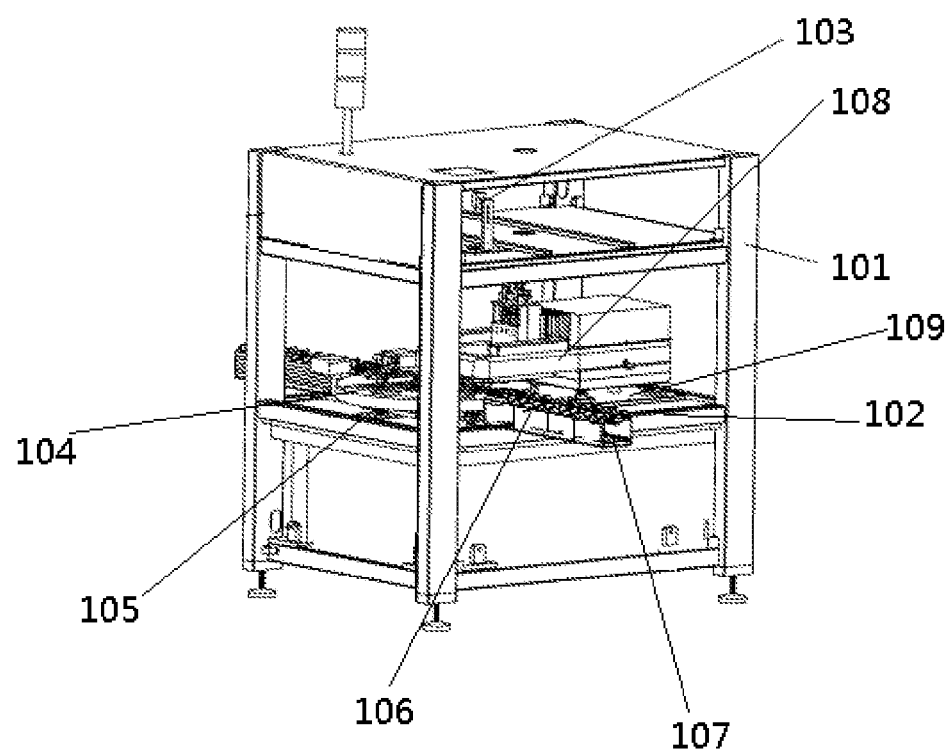
FIG. 1 is a three-dimensional structure chart of the disclosure.
Figure 2:
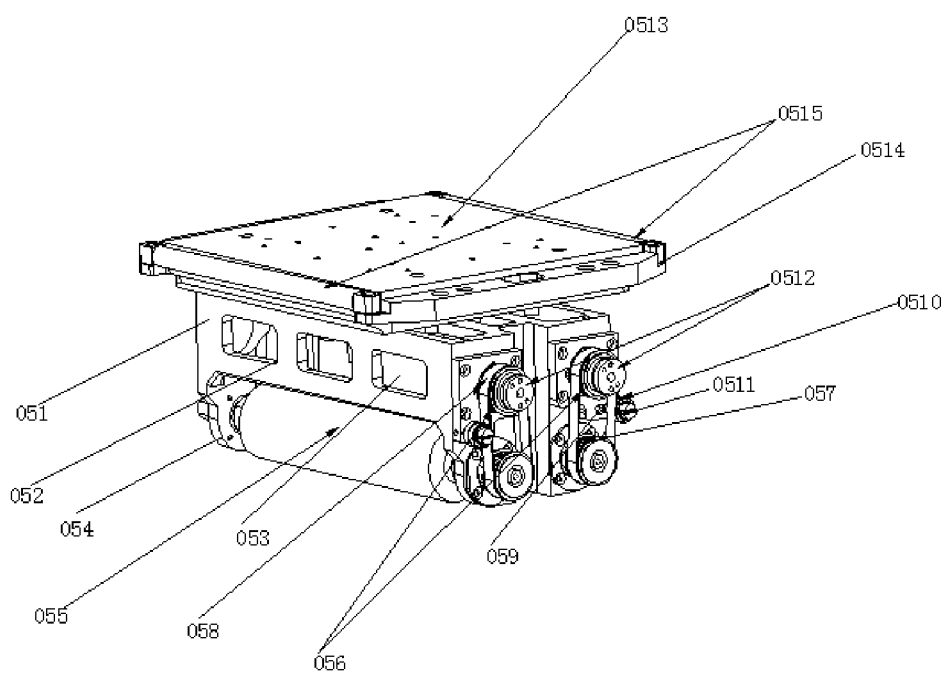
FIG. 2 is a structure diagram of a dual-motor roll paper conveying device of the disclosure.
Figure 3:
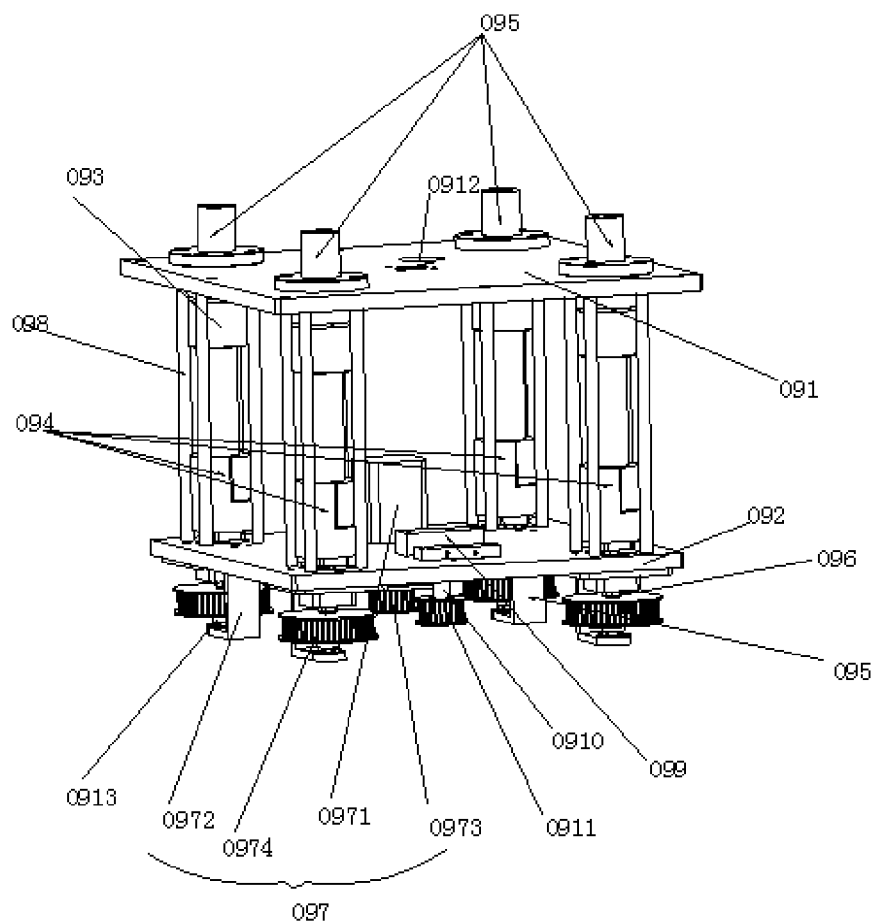
FIG. 3 is a structure diagram of a spline shaft lifting device of the disclosure.
Figure 4:
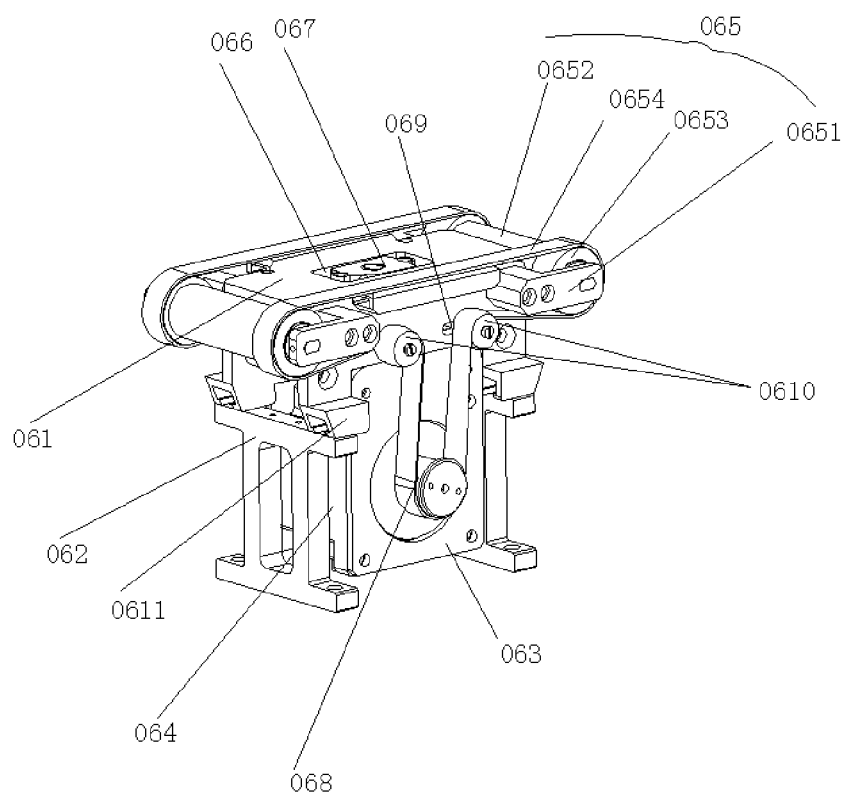
FIG. 4 is a structure diagram of a feeding and discharging modularized conveying device of the disclosure.

As shown in FIG. 1, FIG. 2, FIG. 3 and FIG. 4, the silicon wafer printing machine comprises a rack 101; a middle part partition plate 102 is arranged at the middle part of the rack 101; a visual system installation plate 103 is arranged at the upper part of the rack 101; a rotary table 104 is installed on the middle part partition plate 102; a driving device for controlling the rotary table 104 to rotate according to a fixed rotational angle is arranged at the bottom of the middle part partition plate 102; the rotational angle of the rotary table 104 controlled by the driving device is 90 degrees every time; a group of dual-motor roll paper conveying devices 105 is arranged at an interval of 90 degrees on the edge of the rotary table 104; conveying lines 107 spliced by a plurality of feeding and discharging modularized conveying devices 106 are arranged on the left side and the right side of the rack 101 respectively; a modularized scraper device 108 is arranged on the rear side of the rotary table 104; and a spline shaft lifting device 109 for controlling the modularized scraper device 108 to go up or go down is arranged at the bottom of the middle part partition plate 102.

Preferably, when the rotary table 104 rotates at 90 degrees every time, one dual-motor roll paper conveying device 105 corresponds to the position of the modularized scraper device, and one dual-motor roll paper conveying device 105 corresponds to the conveying lines 107.

Preferably, each dual-motor roll paper conveying device 105 comprises a motor support 051, two side-by-side motor installation sites 052 are arranged on the motor support 051, motors 053 are arranged at the upper parts of the two motor installation sites 052 respectively, two roll paper roller supporting aims 054 are arranged at the lower parts of the motor installation sites 052 respectively, roll paper rollers 055 are arranged on the two roll paper roller supporting arms 054, the output shafts of the two rotors 053 stretch out from one side of the motor support 051 and driving wheels 056 are installed on the stretched output shafts, one end of each of the two roll paper rollers 5 stretches out from one side of the motor support respectively and driven wheels 057 are installed on the starched roller parts, the driving wheels 056 are connected with the driven wheels 057 through synchronous belts 058, and the two motors 053 operate alternatively.

Preferably, the two motors 053 comprise a feeding motor and a discharging motor respectively, the discharging motor does not operate when the feeding motor operates, and the feeding motor does not operate when the discharging motor operates.

Preferably, a tensioning wheel waist-shaped installation hole 059 is formed in one side of each the two motors 052 corresponding to the position of the corresponding synchronous belt 058 respectively, and a tensioning wheel 0510 capable of adjusting the tensioning force of the corresponding synchronous belt 058 is installed inside each tensioning wheel waist-shaped installation hole 059.

Preferably, each tensioning wheel 0510 is used for adjusting the degree of tightness through an adjusting screw 0511.

[0034] Preferably, tensioning sleeves 0512 are installed on the two driving wheels 056 respectively.

Preferably, a glass table panel 0513 is arranged at the upper end of the motor support 051, a screw installation platform 0514 is arranged at the positions of four corners of the glass table panel 0513 respectively, and a driven shaft 0515 is spanned on every two screw installation platforms 0514 corresponding to each other.

Preferably, the two driven shafts 0515 and the two roll paper rollers 055 are connected through paper belts.

Preferably, the spline shaft lifting device 109 comprises an upper fixed plate 091 and a lower fixed plate 092, four upper spline shaft seats 093 are arranged on the upper fixed plate 091 at intervals, four lower spline shaft seats 094 are arranged on the lower fixed plate 092 at intervals, the upper spline shaft seats 093 and the lower spline shaft seats 094 are connected through spline shafts 095, each of the four spline shafts 095 is internally provided with a lifting screw rod 096 respectively, a synchronous wheel control device 097 for controlling the four lifting screw rods 096 to move up and down simultaneously is arranged on the bottom surface of the lower fixed plate 092, and the upper fixed plate 091 and the lower fixed plate 092 are positioned on the edges of spline shafts 095 and are connected through a plurality of supporting shafts 098.

Preferably, the synchronous wheel control device 097 comprises a servo motor 0971 installed at the middle part of the lower fixed plate 092, L-shaped positioning seats 0972 are arranged on the lower panel of the lower fixed plate 092 and correspond to the positions of the lifting screw rods 096, the output shaft of the servo motor 0971 penetrates from the lower fixed plate 092 and motor synchronous wheels 0973 are arranged on penetrated shaft rods, the lower ends of the four lifting screw rods 096 stretch out from the lower fixed plate 092 and lifting screw rod synchronous wheels 0974 are installed on the stretched screw rods, the bottoms of the lifting screw rod synchronous wheels 0974 are installed on the L-shaped positioning seats 0972, and the lifting screw rod synchronous wheels 0974 and the motor synchronous wheels 0973 are connected through the synchronous belts. A tensioning sleeve 0913 sleeves one end of each lifting screw rod installation lifting screw rod synchronous wheel.

Preferably, a tensioning synchronous wheel fixed seat 099 is arranged on the upper surface of the lower fixed plate 092, a tensioning synchronous wheel fixed shaft 0910 is installed on the tensioning synchronous wheel fixed seat 099, the tensioning synchronous wheel fixed shaft 0910 penetrates out from the lower fixed plate 092, tensioning synchronous wheels 0911 are installed on the penetrated shaft rods, and the tensioning synchronous wheels 11 are connected with the lifting screw rod synchronous wheels 0974 and the motor synchronous wheels 0973 through the synchronous belts.

Preferably, the operation of the servo motor 0971 drives the motor synchronous wheels 0973, the motor synchronous wheels 0973 drive the four lifting screw rod synchronous wheels 0974 through the synchronous belts, and when the lifting screw rod synchronous wheels 0974 rotate, the four lifting screw rods 096 go up simultaneously or go down simultaneously.

Preferably, the two tensioning synchronous wheels 0911 are positioned on two sides of the synchronous belts respectively for tensioning the synchronous belts, and the two tensioning synchronous wheels 0911 can adjust the tightness transversely.

Preferably, a wire hole 0912 is formed in the middle part of the upper fixed plate 091.

Preferably, each feeding and discharging modularized conveying device 106 comprises a guide rail supporting platform 061, two guide rail supporting seats 062 arranged vertical to the guide rail supporting platform 061 are arranged on the lower surface of the guide rail supporting platform 061, a motor installation seat 063 is arranged between the two guide rail supporting seats 062, a stepper motor 064 is arranged on the motor installation seat 063, a belt conveying assembly 065 is arranged on the upper surface of the guide rail supporting platform 061, the stepper motor 4 drives the belt conveying assembly 065 to move, and the guide rail supporting seats 062 are connected with the guide rail supporting platform 061 to form a T-shaped support.

Preferably, the belt conveying assembly 065 comprises L-shaped guide roller supporting arms 0651 installed at two ends of the guide rail supporting platform 061 respectively, two rollers 0652 are spanned on the two L-shaped guide roller supporting arms 0651 on the same side, belt wheels 0653 are arranged at two ends of the two rollers 0652 respectively, and every two corresponding belt wheels 0653 are connected through the synchronous belts 0654.

Preferably, an installation hole 066 is formed in the middle part of each guide rail supporting platform 061, and each installation hole 066 is internally provided with a light sensor 067 for sensing the incoming of products.

Preferably, the driving wheels 068 are installed on the output shaft of the stepper motor 064, and the driving wheels 068 are connected with the synchronous belts 0654.

Preferably, two rubber wheel waist-shaped installation hole sites 069 are arranged on one side of each guide rail supporting platform 061, the two rubber wheel waist-shaped installation hole sites 069 are internally provided with driven rubber wheels 0610 capable of adjusting left and right positions, and the two driven rubber wheels 0610 are connected with the synchronous belts 0654.

Preferably, guide rail installation sleeves 0611 are arranged at the upper ends of the two guide rail supporting seats 062 respectively, and the two guide rail supporting seats 062 are H-shaped.

The T-shaped support is adopted, a plurality of modules are assembled on the conveying line of the printing machine, each conveying module is the same in structure and is provided with the driven rubber wheel capable of adjusting the tensioning force, the transportation is smoother, the T-shaped support is convenient for the installation of conveying modules, the installation position of the bottom is reduced, each conveying module is provided with the light sensor respectively to sense the incoming of products, the stepper motor is started when the products are sensed by the light sensor, and the stepper motor does not operate when the products are not sensed, so that the energy sources are saved.

The feeding motor and the discharging motor are adopted, the discharging motor does not operate when the feeding motor operates, the feeding motor does not operate when the discharging motor operates, one roll paper roller is controlled by the feeding motor, the other roll paper roller is controlled by the discharging motor, and the tensioning wheels capable of adjusting the tensioning force are arranged so that roll paper belts are tensioned. Compared with a traditional conveyer device, the product saves the cost of a clutch, the structure is also greatly simplified, and the roll paper belts are easier to maintain and change in later period. The dual-motor conveying devices can prevent the product from being deviated. According to the product, only two driven shafts need to be arranged on the glass table panel, the paper belts are connected with the two roll paper rollers, and the driven shafts are driven by the roll paper rollers through the paper belts directly.

The four lifting screw rods are controlled to go up simultaneously through the servo motor in a lifting manner adopted in the disclosure, the four screw rods are arranged inside the spline shafts respectively, the spline shafts are fixed on the upper spline shaft seat and the lower spline shaft seats, and the movement and synchronous operation of the four screw rods are guaranteed. The device is high in assembly accuracy, greater in load, longer in service life and convenient to maintain.

Although the embodiments of the disclosure have already been illustrated and described, various changes, modifications, replacements and transformations can be made by any person skilled in the art under the condition of without departing from the spirit and the scope of the present invention, and thus the scope of the disclosure should be restricted by claims and equivalent scopes thereof

What is claimed is:

1. A silicon wafer printing machine comprising a rack, a middle part partition plate being arranged at the middle part of the rack, and a visual system installation plate being arranged at the upper part of the rack, characterized in that a rotary table is installed on the middle part partition plate; a driving device for controlling the rotary table to rotate according to a fixed rotational angle is arranged at the bottom of the middle part partition plate; the rotational angle of the rotary table controlled by the driving device is 90 degrees every time; a group of dual-motor roll paper conveying device is arranged at an interval of 90 degrees on the edge of the rotary table; conveying lines spliced by a plurality of feeding and discharging modularized conveying devices are arranged on the left side and the right side of the rack respectively; a modularized scraper device is arranged on the rear side of the rotary table; and a spline shaft lifting device for controlling the modularized scraper device to go up or go down is arranged at the bottom of the middle part partition plate.

2. The silicon wafer printing machine according to claim 1, characterized in that when the rotary table rotates at 90 degrees every time, one dual-motor roll paper conveying device corresponds to the position of the modularized scraper device, and one dual-motor roll paper conveying device corresponds to the conveying lines.

3. The silicon wafer printing machine according to claim 2, characterized in that the dual-motor roll paper conveying device comprises a motor support, two side-by-side motor installation sites are arranged on the motor support, motors are arranged at the upper parts of the two motor installation sites respectively, two roll paper roller supporting arms are arranged at the lower parts of the motor installation sites respectively, roll paper rollers are arranged on the two roll paper roller supporting arms, the output shafts of the two rotors stretch out from one side of the motor support and driving wheels are installed on the stretched output shafts, one end of each of the two roll paper rollers stretches out from one side of the motor support respectively and driven wheels are installed on the starched roller parts, the driving wheels are connected with the driven wheels through a synchronous belt, and the two motors operate alternatively.

4. The silicon wafer printing machine according to claim 3, characterized in that the two motors comprise a feeding motor and a discharging motor respectively, the discharging motor does not operate when the feeding motor operates, and the feeding motor does not operate when the discharging motor operates.

5. The silicon wafer printing machine according to claim 4, characterized in that a tensioning wheel waist-shaped installation hole is formed in one side of each of the two motors corresponding to the position of the synchronous belt respectively, and a tensioning wheel capable of adjusting the tensioning force of the synchronous belt is installed inside each tensioning wheel waist-shaped installation hole.

6. The silicon wafer printing machine according to claim 5, characterized in that each tensioning wheel is used for adjusting the degree of tightness through an adjusting screw, tensioning sleeves are installed on the two driving wheels respectively, a glass table panel is arranged at the upper end of the motor support, a screw installation platform is arranged at the positions of four corners of the glass table panel respectively, a driven shaft is spanned on every two screw installation platforms corresponding to each other, and the two driven shafts and the two roll paper rollers are connected through paper belts.

7. The silicon wafer printing machine according to claim 2, characterized in that the spline shaft lifting device comprises an upper fixed plate and a lower fixed plate, four upper spline shaft seats are arranged on the upper fixed plate at intervals, four lower spline shaft seats are arranged on the lower fixed plate at intervals, the upper spline shaft seats and the lower spline shaft seats are connected through spline shafts, each of the four spline shafts is internally provided with a lifting screw rod respectively, a synchronous wheel control device for controlling the four lifting screw rods to move up and down simultaneously is arranged on the bottom surface of the lower fixed plate, and the upper fixed plate and the lower fixed plate are positioned on the edges of spline shafts and are connected through a plurality of supporting shafts.

8. The silicon wafer printing machine according to claim 7, characterized in that the synchronous wheel control device comprises a servo motor installed at the middle part of the lower fixed plate, L-shaped positioning seats are arranged on the lower panel of the lower fixed plate and correspond to the positions of the lifting screw rods, the output shaft of the servo motor penetrates from the lower fixed plate and a motor synchronous wheel is arranged on a penetrated shaft rod, the lower ends of the four lifting screw rods stretch out from the lower fixed plate and lifting screw rod synchronous wheels are installed on the stretched screw rods, the bottoms of the lifting screw rod synchronous wheels are installed on the L-shaped positioning seats, a tensioning sleeve sleeves one end of each lifting screw rod installation lifting screw rod synchronous wheel, and the lifting screw rod synchronous wheels and the motor synchronous wheel are connected through the synchronous belts;

a tensioning synchronous wheel fixed seat is arranged on the upper surface of the lower fixed plate, a tensioning synchronous wheel fixed shaft is installed on the tensioning synchronous wheel fixed seat, the tensioning synchronous wheel fixed shaft penetrates out from the lower fixed plate, tensioning synchronous wheels are installed on the penetrated shaft rods, and the tensioning synchronous wheels are connected with the lifting screw rod synchronous wheels and the motor synchronous wheels through the synchronous belts;

the operation of the servo motor drives the motor synchronous wheels, the motor synchronous wheels drive the four lifting screw rod synchronous wheels through the synchronous belts, and when the lifting screw rod synchronous wheels rotate, the four lifting screw rods go up simultaneously or go down simultaneously; the two tensioning synchronous wheels are positioned on two sides of the synchronous belts respectively for tensioning the synchronous belts, and the two tensioning synchronous wheels can adjust the tightness transversely; and a wire hole is formed in the middle part of the upper fixed plate.

9. The silicon wafer printing machine according to claim 2, characterized in that each feeding and discharging modularized conveying device comprises a guide rail supporting platform, two guide rail supporting seats arranged vertical to the guide rail supporting platform are arranged on the lower surface of the guide rail supporting platform, a motor installation seat is arranged between the two guide rail supporting seats, a stepper motor is arranged on the motor installation seat, a belt conveying assembly is arranged on the upper surface of the guide rail supporting platform, the stepper motor drives the belt conveying assembly to move, and the guide rail supporting seats are connected with the guide rail supporting platform to form a T-shaped support.

10. The silicon wafer printing machine according to claim 1, characterized in that the belt conveying assembly comprises L-shaped guide roller supporting arms installed at two ends of the guide rail supporting platform respectively, two rollers are spanned on the two L-shaped guide roller supporting arms on the same side, belt wheels are arranged at two ends of the two rollers respectively, and every two corresponding belt wheels are connected through the synchronous belts;

an installation hole is formed in the middle part of each guide rail supporting platform, and each installation hole is internally provided with a light sensor for sensing the incoming of products; the driving wheels are installed on the output shaft of the stepper motor, and the driving wheels are connected with the synchronous belts; two rubber wheel waist-shaped installation holes are formed in one side of each guide rail supporting platform, the two rubber wheel waist-shaped installation holes are internally provided with driven rubber wheels capable of adjusting left and right positions, and the two driven rubber wheels are connected with the synchronous belts; guide rail installation sleeves are arranged at the upper ends of the two guide rail supporting seats respectively, and the two guide rail supporting seats are H-shaped.

\* \* \* \* \*